(12) United States Patent
Brouk et al.

(10) Patent No.: US 7,157,857 B2
(45) Date of Patent: Jan. 2, 2007

(54) STABILIZING PLASMA AND GENERATOR INTERACTIONS

(75) Inventors: Victor L. Brouk, Fort Collins, CO (US); Randy L. Heckman, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 10/741,226

(22) Filed: Dec. 19, 2003

(65) Prior Publication Data

US 2005/0134186 A1 Jun. 23, 2005

(51) Int. Cl.
*H01J 7/24* (2006.01)
*H01B 31/26* (2006.01)

(52) U.S. Cl. ............................. 315/111.21; 315/111.81

(58) Field of Classification Search .......... 315/111.21, 315/111.71, 111.81; 118/723 AN, 723 ME, 118/723 MW
See application file for complete search history.

(56) References Cited

U.S. PATENT DOCUMENTS

| | | | | |
|---|---|---|---|---|
| 5,195,045 A | * | 3/1993 | Keane et al. ............... | 702/107 |
| 5,441,596 A | | 8/1995 | Nulty | |
| 5,643,364 A | | 7/1997 | Zhao et al. | |
| 5,747,935 A | | 5/1998 | Porter et al. | |
| 5,815,047 A | * | 9/1998 | Sorensen et al. ........... | 333/17.3 |
| 5,842,154 A | * | 11/1998 | Harnett ....................... | 702/106 |
| 5,929,717 A | | 7/1999 | Richardson et al. ....... | 333/17.3 |
| 6,046,546 A | * | 4/2000 | Porter et al. ............. | 315/111.21 |
| 6,305,316 B1 | * | 10/2001 | DiVergilio et al. ........ | 118/723 I |
| 6,313,584 B1 | | 11/2001 | Johnson et al. | |
| 6,399,507 B1 | | 6/2002 | Nallan et al. | |
| 6,631,693 B1 | * | 10/2003 | Hilliker .................. | 118/723 E |
| 6,777,881 B1 | * | 8/2004 | Yuzurihara et al. ..... | 315/111.81 |
| 6,838,832 B1 | * | 1/2005 | Howald et al. .......... | 315/111.21 |
| 2002/0179247 A1 | * | 12/2002 | Davis et al. ............ | 156/345.33 |

OTHER PUBLICATIONS

Lieberman, M.A., et al., Instabilities in Low Pressure Inductive Discharges with Attaching Gases, 1999 American Institute of Physics, pp. 3617-n3619.
Descoeudres, A., et al., Attachment-induced Ionization Instability in Electronegative Capacitive RF Discharges, Plasma Sources Sci. Technol. 12 (2003), pp. 152-157.
Goodman, D.L., Active Control of Instabilities for Plasma Processing with Electronegative Gases; J. Phys. D: Appl. Phys. 36 (2003); pp. 2845-2852.

* cited by examiner

*Primary Examiner*—Shih-Chao Chen
*Assistant Examiner*—Minh Dieu A

(57) ABSTRACT

An approach for stabilizing the interactions between a plasma and the generator powering the plasma is provided. Reactive elements disposed between the power generator and plasma operate to modify the apparent impedance characteristics of the plasma such that the trajectory of the plasma load impedance as a function of power is substantially aligned locally with the contours of constant power output in impedance space. In this way, instabilities in the generator and plasma system are avoided because reinforcement or amplification of fluctuations in plasma impedance due to interactions between the generator and the plasma are reduced or eliminated. The reactive elements may be variable in order to align plasma trajectories and generator power contours under a range of process conditions.

14 Claims, 11 Drawing Sheets

STABILIZING PLASMA AND GENERATOR INTERACTIONS

BACKGROUND OF THE INVENTION

1. Field of the Invention

This invention relates generally to plasma processing systems, and more particularly to apparatus and methods for stabilizing interactions between plasmas and power delivery systems.

2. Brief Description of the Prior Art

Plasma processing systems are widely used in a variety of industries for modifying the surface properties of materials. For example, the manufacture of modern integrated circuits generally involves many processing steps that use plasmas for etching of submicrometer features, or for depositing atomically thin layers of materials.

A typical plasma processing system comprises a processing chamber and a power delivery system that creates and maintains the plasma inside the chamber. Electrically, the plasma is a load with a characteristic impedance that is driven by the power generator. The impedance of a processing plasma is generally not constant, however, but may vary depending upon process conditions or other variables. Variations in plasma impedance may adversely affect the power delivery from the generator, which typically provides optimal power delivery only for a particular load impedance. These variations may also result in undesired drifts or perturbations in process variables, such as etch or deposition rates, due to changes in the physical properties of the plasma at different power levels. As a result, plasma processing systems are often equipped with impedance matching and control mechanisms or circuitry that respond to changes in plasma impedance and maintain desired levels of power delivery to the plasma.

The use of impedance matching systems and control circuitry is not always sufficient to ensure stability of the plasma in a plasma processing system, particularly in operating regimes where plasma properties fluctuate rapidly or exhibit nonlinear behaviors. U.S. Pat. No. 5,441,596, for example, describes a method of stabilizing power furnished to a plasma by engaging an impedance matching network only after the plasma has been ignited and stabilized at an initially low power level. Others in the field have addressed problems of plasma instability by looking to improvements in the speed and sophistication of matching network technology, as described for example in U.S. Pat. No. 6,313,584. In processing applications powered by modern switch-mode power generators, plasma stability may also be enhanced by incorporating circuitry that absorbs and dissipates energy at frequencies distant from the fundamental frequency of the power furnished by the generator, as described for example in U.S. Pat. No. 5,747,935.

Despite these improvements, problems of plasma instability in many semiconductor fabrication operations remain, particularly those involving the use of electronegative process gases. This is due in part to the trend toward reduced feature size of semiconductor products, which often requires process operations at reduced power levels and gas pressures for critically dimensioned features. In these process regimes, fluctuations or oscillations in plasma properties may occur due to competing physical interactions among the plasma constituents, as for example fluctuations in ion density due to time-varying rates of ionization and electron attachment in a plasma formed of an electronegative gas. See, e.g., M. A. Lieberman et al., "Instabilities in low-pressure inductive discharges with attaching gases," 75 Applied Physics Letters 23 (Dec. 6, 1999) 3617–19; A. Descoeudres et al., "Attachment-induced ionization instability in electronegative capacitive RF discharges," Plasma Sources Sci. Technol. 12 (2003) 152–57. As a result, the impedance of the plasma can become strongly dependent upon power level and may even exhibit negative impedance characteristics; that is, an increase in current will result in a decrease in voltage across the plasma, causing even more current to be conducted through the plasma. When attempting to operate in these low power and pressure regimes, unstable voltage oscillations may occur within the plasma that are beyond the capabilities of the power supply or impedance matching control loops to counteract, resulting in uncontrollable and unrepeatable variations in process parameters.

Plasma instability phenomena encountered in low power and pressure process regimes may be further compounded by the electrical characteristics of modern switch-mode power supplies. It has been observed that in a given process regime, plasma instabilities may result when powering the plasma with certain radio frequency (RF) power generators but not others. As a general matter, processes that employ modern switch-mode power supplies to power the plasma are found to be more susceptible to plasma instabilities at low powers and pressures, due primarily to the increased sensitivity of the open-loop power output of these compact, high efficiency generators to the impedance of the plasma load compared to that of generators based on older linear technology. When the open-loop power output of a power generator varies significantly with load impedance, the generator may interact with the plasma load in a way such that fluctuations in plasma impedance are reinforced or amplified by the delivery system, resulting in unstable oscillations in plasma properties and a detrimental impact on the process. These fluctuations may in some cases be exacerbated by unsuccessful actions of the generator power control loop to correct for the power variances, or may occur outside the control bandwidth of the generator altogether.

A conventional approach to problems of plasma instabilities at low powers and pressures has been simply to avoid operation in those regimes, or to alter other process parameters, such as gas flow rates and ratios, in order to stabilize the plasma. U.S. Pat. No. 6,399,507, for example, describes a method of extending the stability of a processing plasma into low power regimes by increasing gas pressures and apportioning the power furnished to the plasma between capacitive and inductive components. In some cases, plasma stabilization has been demonstrated using high bandwidth, high gain feedback control of the plasma RF generator, as described for example in D. L. Goodman and N. M. P. Benjamin, "Active control of instabilities for plasma processing with electronegative gases," J. Phys. D: Appl. Phys. 36 (2003) 2845–2852. Many process engineers have also observed that adding particular lengths of transmission line between the power generator and process chamber has the effect in some cases of stabilizing an otherwise unstable plasma process. Use of this technique has been largely empirical and ad hoc, however, and procedures for determining how and when it may be effective have not heretofore been offered. Indeed, process engineers today are taught as a general matter to avoid the use of transmission lines or of otherwise introducing electrical delays into the coupling between a power generator and the plasma it powers (see, e.g., U.S. Pat. No. 5,643,364). Moreover, a growing trend in plasma processing systems toward direct mounting of the power generator on the chamber is removing the transmission line as an available means of stabilizing the plasma in unstable regimes.

It would be desirable if the stability of processing plasmas could be extended into otherwise unstable processing regimes without the need to alter process parameters, or to search by trial and error for particular lengths of transmission lines that stabilize the plasma. It would be further desirable to provide a means of stabilizing processing plasmas not only in a single operating condition, but under a range of useful process regimes.

SUMMARY OF THE INVENTION

This invention provides methods and apparatus for stabilizing the interactions between a plasma and the generator powering the plasma. The invention generally comprises reactive elements that operate to modify the apparent impedance characteristics of the plasma such that the trajectory of the plasma load impedance as a function of power is substantially aligned locally with the contours of constant power output in impedance space. In this way, unstable and uncontrollable oscillations in plasma power are avoided because reinforcement or amplification of fluctuations in plasma impedance due to interactions between the generator and the plasma are reduced or eliminated.

In one embodiment, the invention features a network of reactive circuit elements disposed between an alternating current radio frequency (RF) power generator and plasma chamber of a plasma processing system. The reactive network has the effect of rotating the plasma load impedance trajectory so that for a particular operating regime of interest, the plasma trajectory is substantially aligned with the contours of constant power output of the generator in impedance space. As a result, should a fluctuation in plasma impedance occur, the power generator does not respond with a change in power output, but rather continues to deliver substantially the same power to the plasma. By aligning or matching the contours of constant power output of the generator and the plasma impedance trajectory, interactions between the two that may otherwise lead to plasma instabilities are avoided.

In one embodiment of the invention, a trajectory matching circuit comprising a network of inductive and capacitive elements is disposed at the output of a power generator. The elements of the trajectory matching circuit are selected and arranged so as to rotate the plasma impedance trajectory sufficiently to align with the generator power contours, while leaving unchanged the steady state impedance of the plasma at the desired operating condition. In this way, the trajectory matching circuit does not interfere with the operation of impedance matching circuitry or mechanisms employed within or together with the generator for optimal power delivery. In other embodiments, the functions of trajectory matching and impedance matching are combined into a single circuit. In these embodiments, the elements of the circuit are selected and arranged so as to rotate the plasma trajectory to align with the generator power contours, while substantially matching the steady state impedance of the plasma to the output impedance of the generator at the desired operating condition.

In other embodiments, one or more elements of a trajectory matching circuit are provided in part or in whole by the reactive properties of a power transmission line disposed between the RF generator and the plasma. A trajectory matching procedure is employed to determine an optimal length of the transmission line for plasma stability based upon the reactive electrical properties of the transmission line. At its optimized length, the transmission line causes the plasma trajectory to rotate in impedance space so as to align with the generator power contours.

The trajectory matching elements of the invention may have fixed electrical properties that align the plasma trajectory under specific operating conditions. In other embodiments, one or more of the elements of a trajectory matching circuit are variable or switchable. By including variability in the configuration of the trajectory matching circuitry, the invention provides the ability to match plasma trajectories under a range of process conditions.

In some embodiments of the invention, either fixed or variable elements producing a suitable degree of trajectory rotation are provided based upon preexisting measurements and analyses of generator power contours and plasma impedance trajectories. In other embodiments, impedance characteristics of the plasma are measured during process operation and used to monitor the plasma trajectory in real time. In the event that the plasma impedance trajectory changes during process operation, or is not known in advance, a switchable or variable trajectory matching circuit responds to bring the measured values of the plasma trajectory into alignment with the constant power contours of the generator.

BRIEF DESCRIPTION OF THE DRAWINGS

FIG. 6b illustrates the dependence of system stability gain on the length of transmission line for the embodiment of the invention depicted in FIG. 6a.

FIG. 6c is a Smith chart showing rotation of the plasma impedance trajectory for the embodiment of the invention depicted in FIG. 6a.

DETAILED DESCRIPTION

Figure 1A:
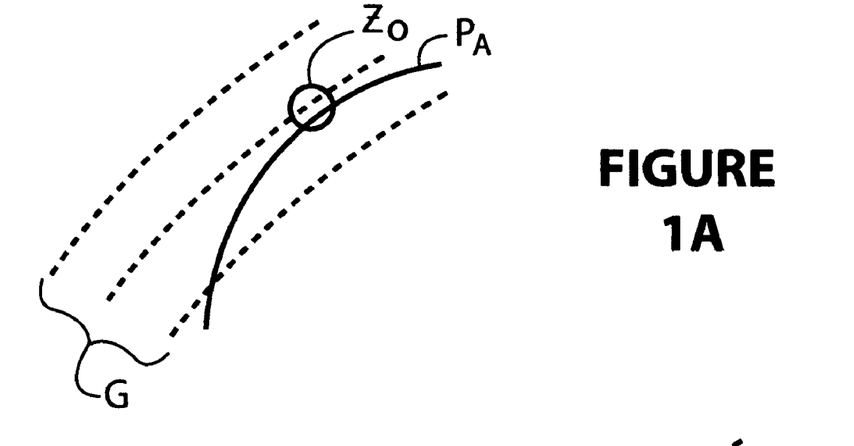
FIGS. 1a, 1b, and 1c illustrate examples of plasma impedance trajectories and power generator impedance contours in impedance space.
Figure 1B:
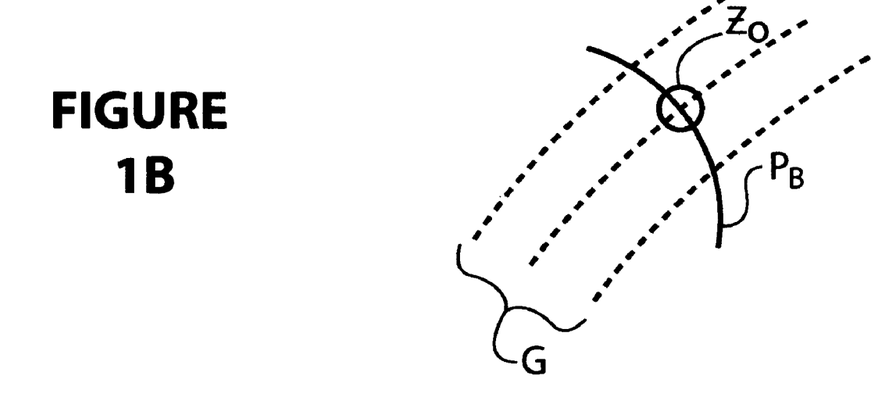
Figure 1C:
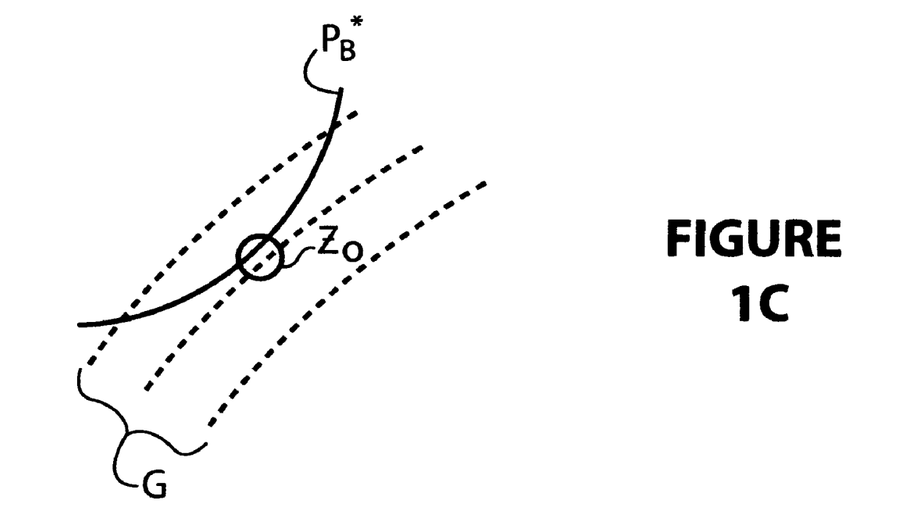

FIGS. 1a, 1b, and 1c illustrate the general concept of trajectory matching in impedance space in order to stabilize interactions between a power delivery system and a plasma.

The two dimensions of the space are the real and imaginary components of complex impedance. The coordinate system may be of any type including Cartesian, polar, or as represented in a Smith chart. For a given power generator, contours G define the set of impedance values at which the generator will deliver constant levels of power output. The contours represent the open-loop power output of the generator; that is, the power that the generator will deliver at various values of load impedance in the absence of any action by a power control loop. Also depicted in the impedance space are curves defining the real and imaginary impedance values of a plasma as a function of power delivered to the plasma. In FIG. 1a, curve $P_A$ has a trajectory, or slope, that is substantially aligned with the open-loop generator contours G in the region of at an operating point $Z_0$. In FIG. 1b, curve $P_B$ has a trajectory that is not aligned with the generator contours at the operating point $Z_0$.

In any plasma processing system, fluctuations or oscillations in the plasma properties may occur due to competing physical interactions among the plasma constituents, particularly in plasmas formed of electronegative processing gases. In FIGS. 1a and 1b, these fluctuations cause the plasma impedance to deviate from operating point $Z_0$ along curve $P_A$ or $P_B$, respectively. In FIG. 1a, because the plasma impedance trajectory is aligned with the generator contours, the fluctuations in plasma impedance occur substantially along a contour of constant power output from the generator. As a result, little or no reaction of the generator occurs that would reinforce or amplify the plasma impedance fluctuations. In FIG. 1b, because the plasma impedance trajectory is not aligned with the generator contours, the fluctuations in plasma impedance result in fluctuations in power output from the generator, which may in turn reinforce or amplify the plasma impedance fluctuations. The misaligned plasma trajectory of FIG. 1b thus represents a potentially unstable system condition.

In FIG. 1c, the plasma trajectory of FIG. 1b has been rotated in impedance space by the addition of electrical reactance or delay between the power delivery system and the plasma resulting in plasma impedance trajectory $P_B^*$ that is substantially aligned with the generator contours G in the vicinity of the operating point $Z_0$. As a result, fluctuations or oscillations in plasma impedance occur substantially along a contour of constant power output from the generator, as in the case of the system depicted in FIG. 1a.

Figure 2:
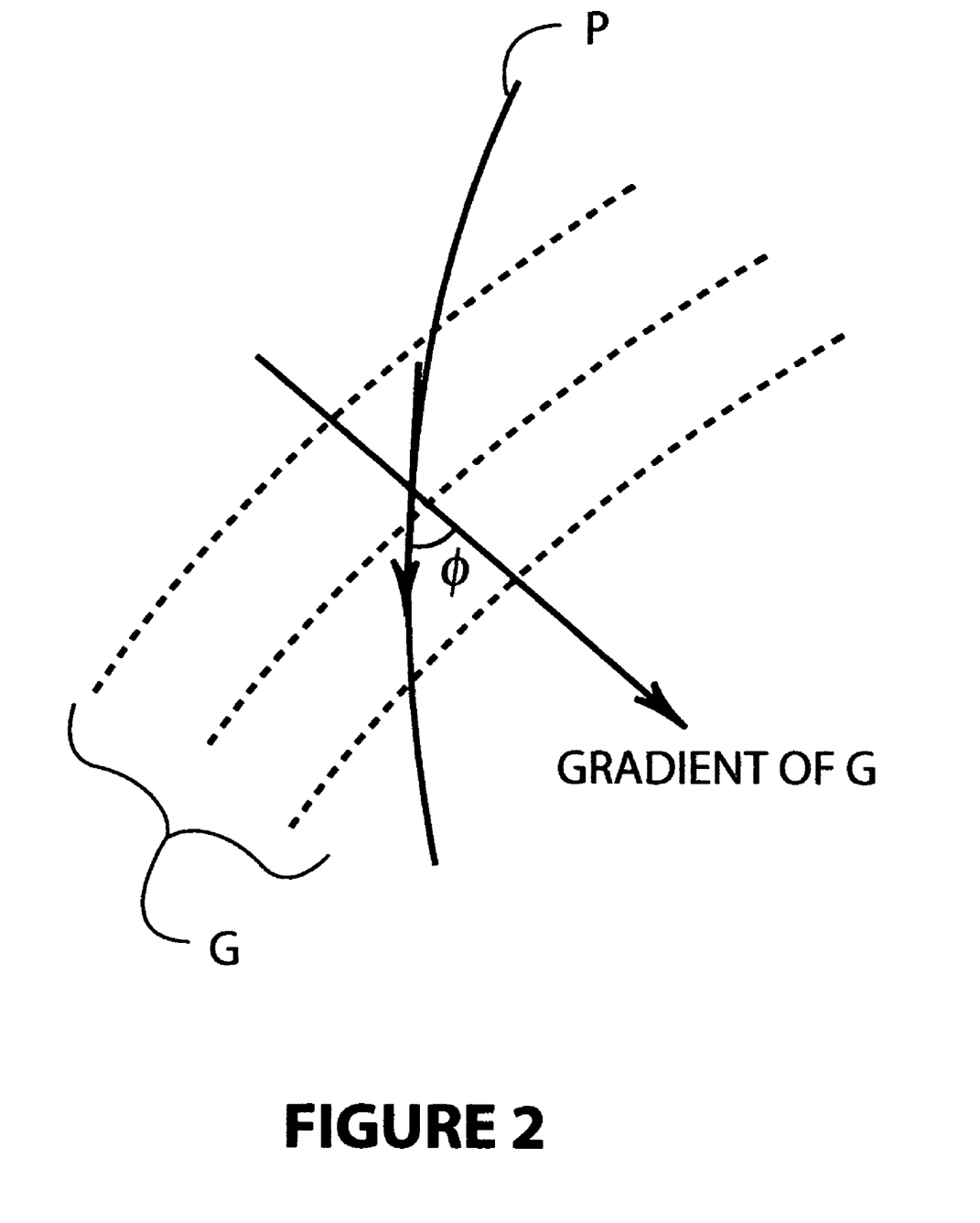
FIG. 2 illustrates the angle between the plasma trajectory and the gradient of the generator power contours in impedance space.

The effect of trajectory matching may also be appreciated by analyzing interactions between a generator and a plasma using classic control loop theory. A generator and plasma form a dynamic loop, with the dependence of the power output of the generator upon load impedance representing the gain of the generator, and the dependence of the plasma impedance upon power level representing the gain of the plasma. The generator and plasma gains, and the relative orientation of the plasma trajectory and generator contours in impedance space, are used to quantify the system gain and its probability of stability according to the following expression:

$$\text{System Gain} = \left|\frac{\Delta P/P}{\Delta Z/Z}\right|_G \left|\frac{\Delta Z/Z}{\Delta P/P}\right|_P \cos(\phi)$$

where $\Delta P/P$ is a normalized change in power, $\Delta Z/Z$ is a normalized change in impedance, subscripts G and P denote gains of the generator and plasma, respectively, and $\phi$ is the angle between the plasma trajectory and the generator power contour gradient as illustrated in FIG. 2. A generator/plasma system is generally stable if the expression above is less than one, and unstable if greater than one. Where the product of the magnitudes of the plasma and generator gains is much less than one, the system is inherently stable regardless of the angle $\phi$. Where the product of the gains is substantial, however, stability of the system depends on the angle between the plasma trajectory and the gradient of the generator power contours. In those cases, if the generator contours and plasma trajectory are aligned in the vicinity of a given operating point, and changes in plasma impedance therefore occur substantially along a contour of constant power output from the generator, then the cosine term of the angle is nearly zero, and the generator/plasma system is stable.

Figure 3:
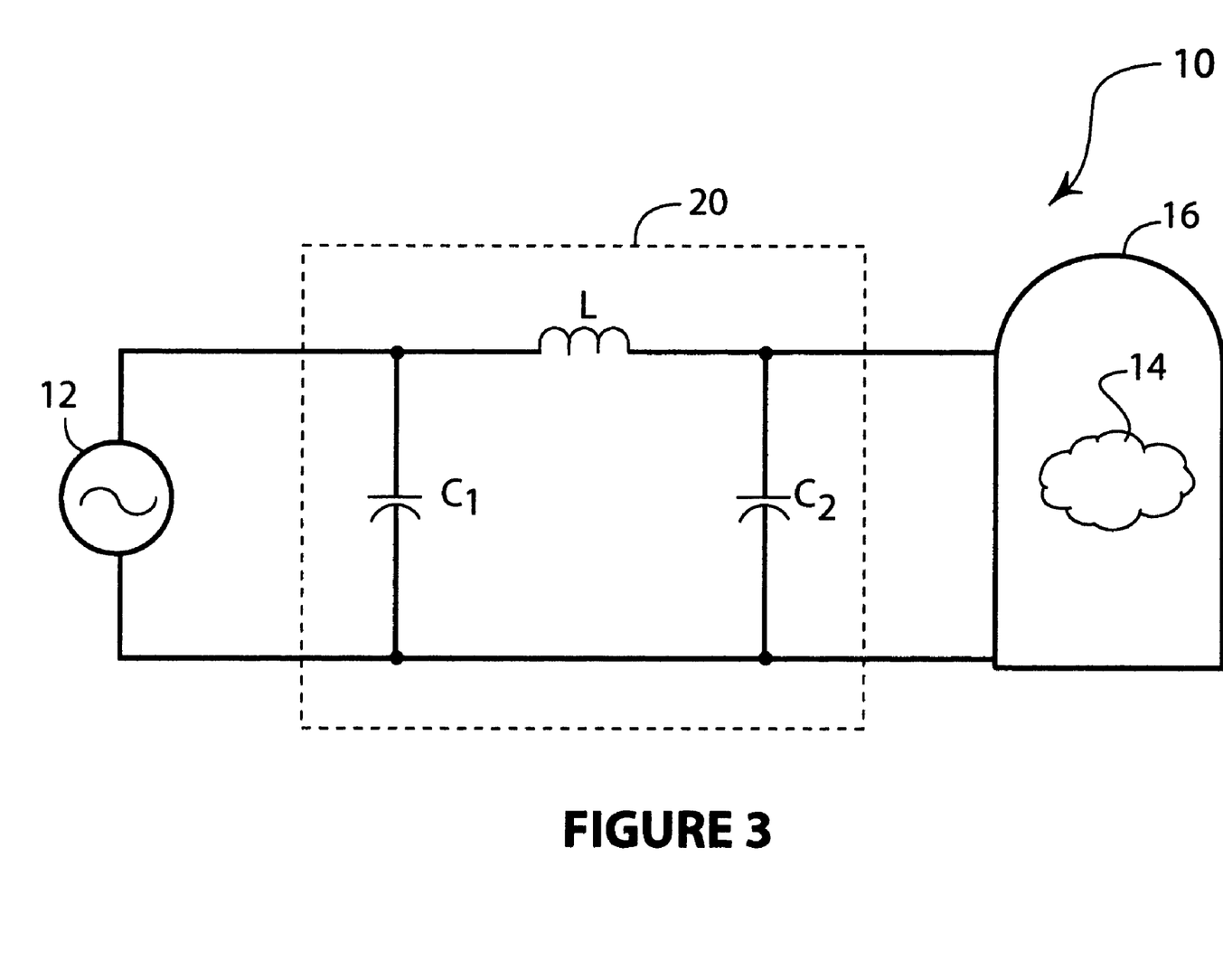
FIG. 3 is a schematic representation of a plasma processing system having a trajectory matching circuit between the generator and plasma chamber in accordance with an embodiment of the invention.

FIG. 3 illustrates a plasma processing system having a trajectory matching circuit for stabilizing the process plasma in accordance with one embodiment of the invention. A plasma processing system 10 comprises a power generator 12 that provides alternating current power to a processing plasma 14 contained within a process chamber 16. Disposed between generator 12 and plasma 14 is a trajectory matching circuit 20. Although not shown, the processing system may also include an impedance matching network or mechanism as part of or in addition to power generator 12. Furthermore, while trajectory matching circuit 20 is depicted in FIG. 3 as a component of the plasma processing system 10 separate from generator 12, it will be readily appreciated that the trajectory matching circuitry could alternatively be incorporated within the physical enclosure of the power generator or other components of a plasma processing system.

In the embodiment of FIG. 3, trajectory matching circuit 20 comprises a series inductor L and parallel capacitors $C_1$ and $C_2$. In this embodiment, $C_1=C_2=C$ and L is chosen such that the effective output impedance of the generator $Z_0$ remains unchanged. The degree of rotation of the plasma impedance trajectory is related inversely to the resonant frequency of the trajectory matching circuit, and is therefore nearly proportional to $\sqrt{(L*C)}$.

Figure 4:
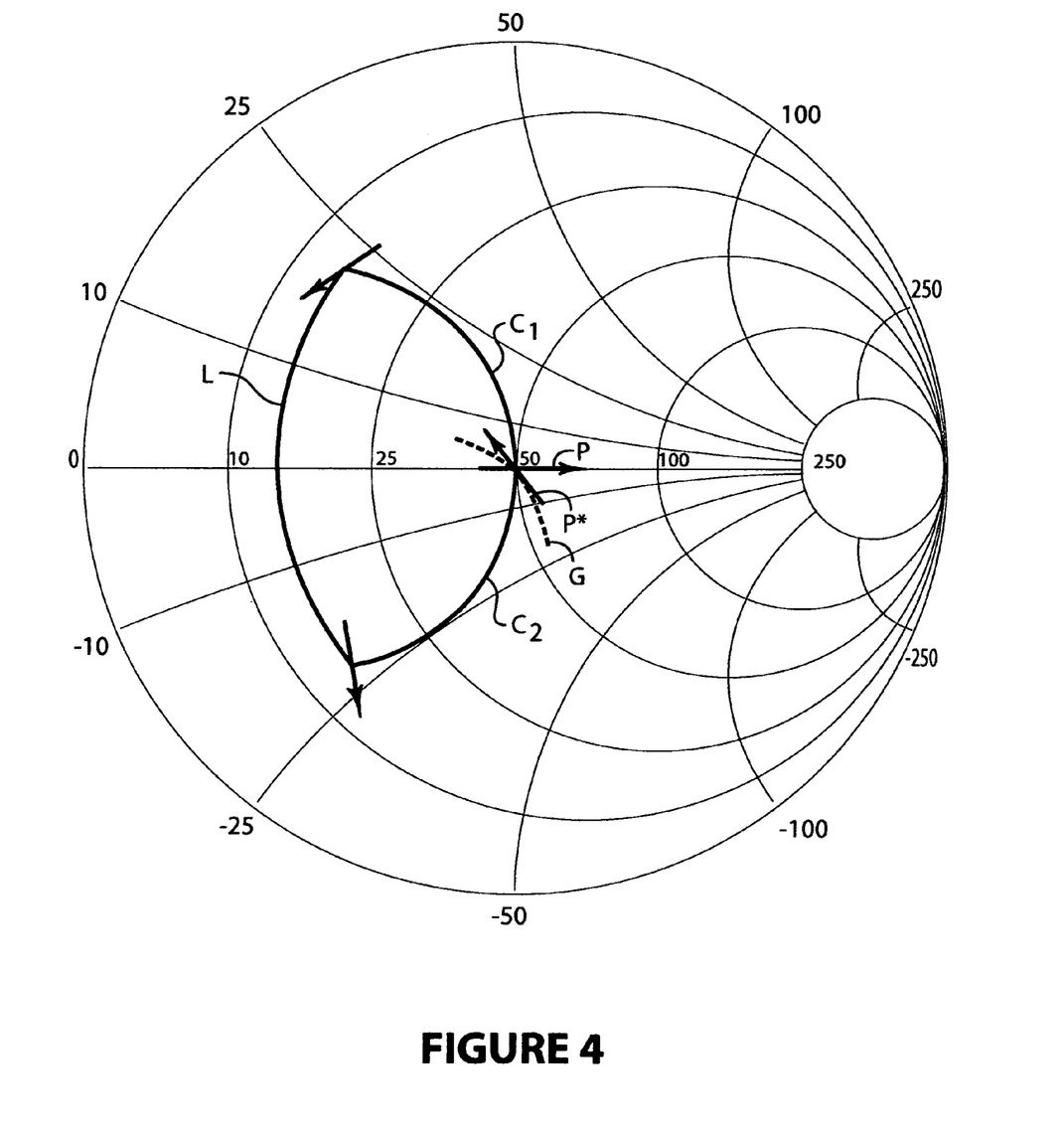
FIG. 4 is a Smith chart showing rotation of the plasma impedance trajectory for the embodiment of the invention depicted in FIG. 3.

FIG. 4 illustrates the operation in impedance space of the trajectory matching circuit depicted in FIG. 3 in the form of a Smith chart. Curve P is the plasma impedance trajectory determined through measurement of plasma electrical properties for varying levels of power delivered to the plasma. With no trajectory matching circuitry present, the plasma has trajectory P that has a center impedance of 50 ohms, but that is not aligned with the generator constant power contour G. The trajectory matching circuit components have the effect of shifting the impedance of the plasma along vectors $C_2$, L, and $C_1$, respectively, so that the effective center output impedance remains unchanged at 50 ohms. The trajectory matching circuit causes the plasma impedance trajectory to rotate, however, to new trajectory P* that is aligned with the generator power contour G. As a result, potentially unstable interactions between the generator and plasma are avoided.

Figure 5:
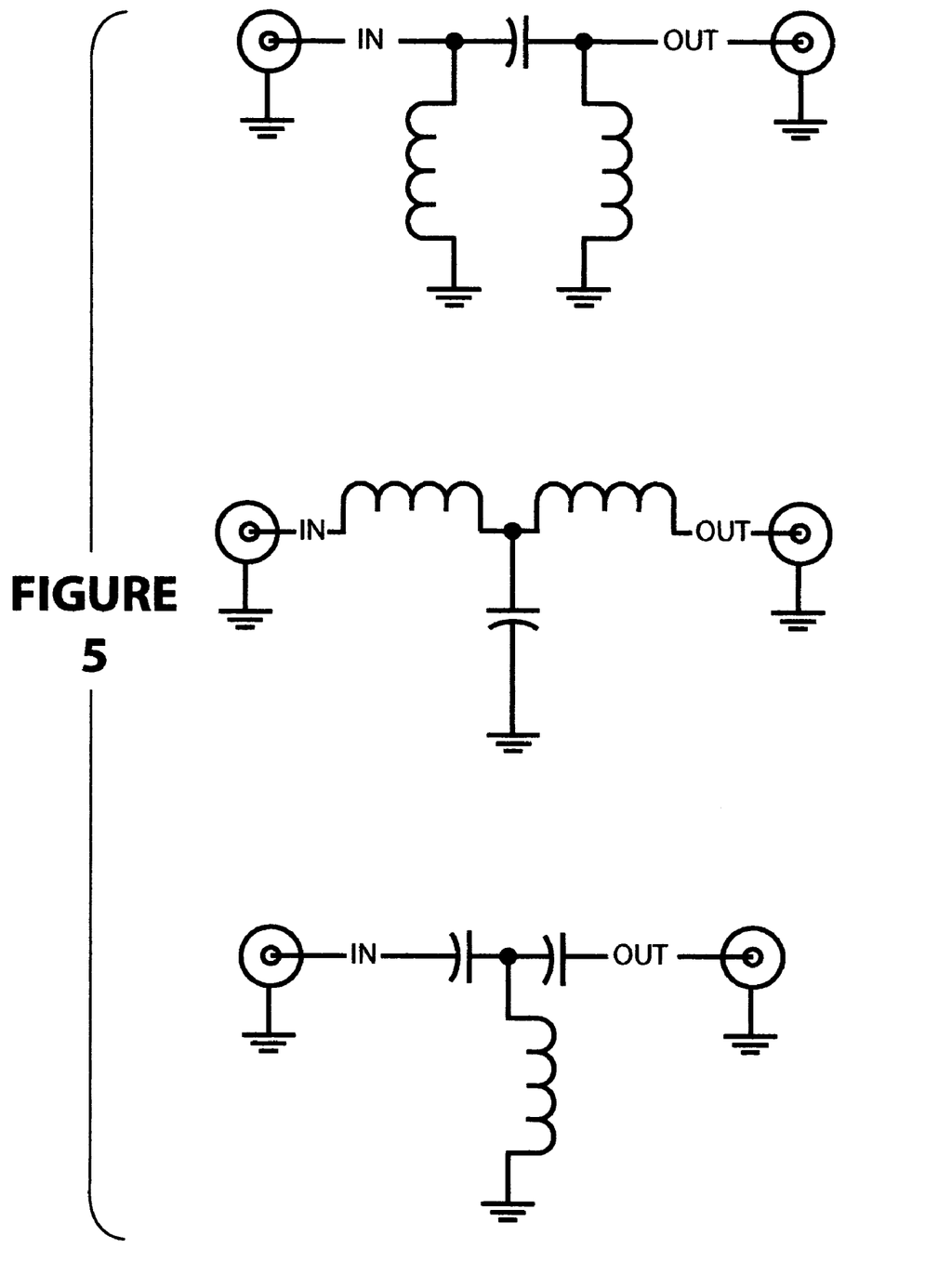
FIG. 5 illustrates trajectory matching circuits in accordance with alternative embodiments of the invention.

Preferably, trajectory matching circuitry in accordance with embodiments of the invention should comprise at least a third order reactive network to ensure that the desired degree of trajectory rotation is achieved while leaving steady state impedance unchanged. FIG. 5 presents examples of alternative embodiments of trajectory matching circuits in accordance with the present invention having various third order combinations of capacitive and inductive elements. A trajectory matching circuit of less than third order may be employed by operating the circuit in connection with reactive elements present elsewhere in the power delivery system, or if a steady state impedance mismatch can be tolerated. Trajectory matching networks of higher than third order may also be employed in accordance with the invention. For example, a trajectory matching network having more than three reactive elements may be beneficial to account for plasma harmonics or the dependence of impedance upon frequency of operation of the generator. In certain embodiments of the invention, trajectory matching networks of higher than third order are employed to match more closely the higher order characteristics of the impedance contours of a plasma for even greater levels of plasma stability.

Depending upon the electrical and mechanical architecture of a given processing system and power generator, elements of a trajectory matching circuit may be furnished by parasitic or leakage reactance associated with various subsystems or components within the system. Trajectory matching may also be accomplished using the reactive properties of a power transmission line that has been optimized for plasma stability in accordance with the present invention. By employing a trajectory matching methodology, the invention makes it possible to identify readily without a cumbersome process of trial and error particular types and lengths of power transmission lines disposed between a power generator and process chamber that will avoid unstable generator/plasma interactions.

Figure 6A:
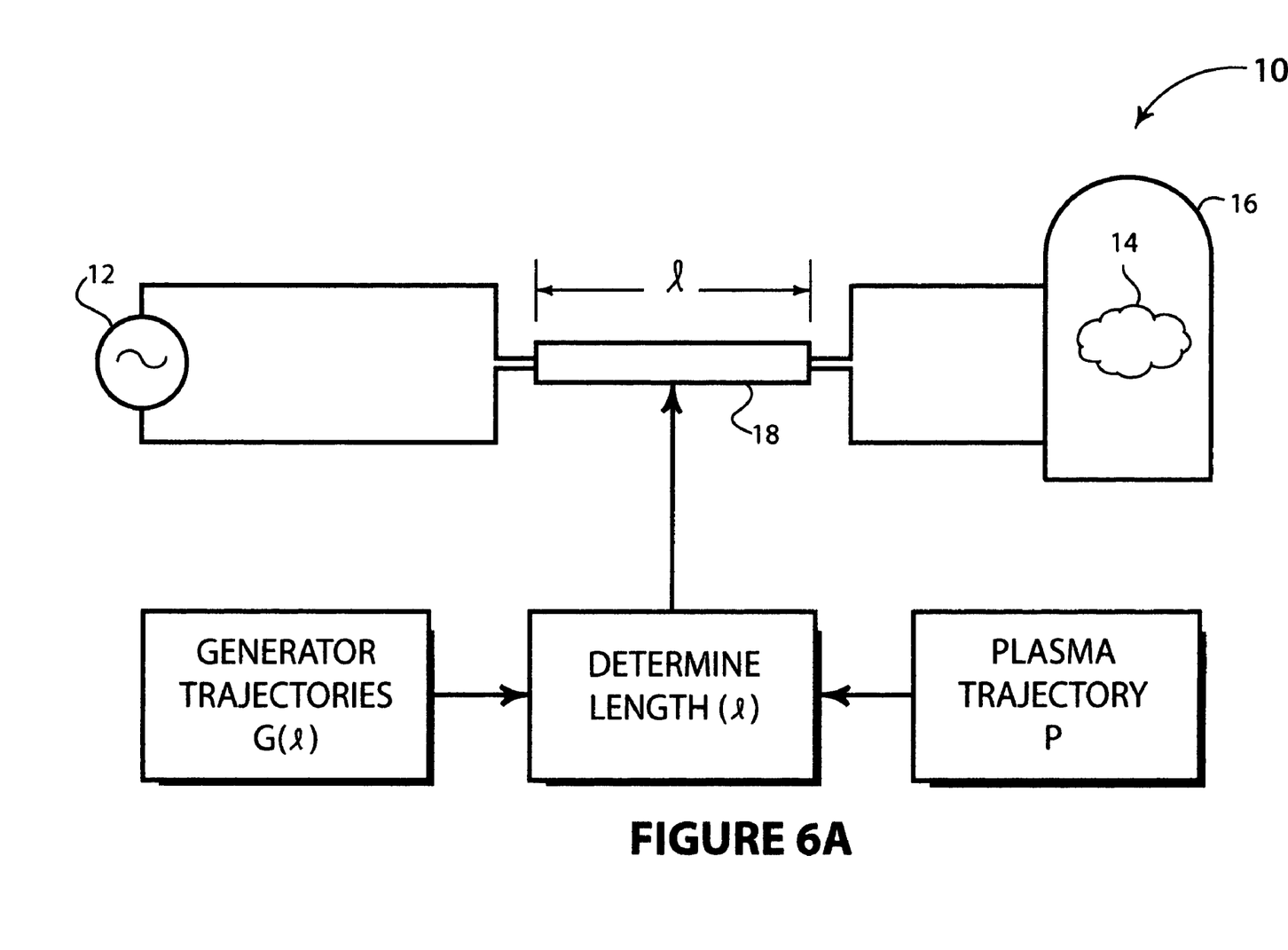
FIG. 6a is a schematic representation of a plasma processing system utilizing a transmission line between the generator and plasma chamber in accordance with an embodiment of the invention.
Figure 6B:
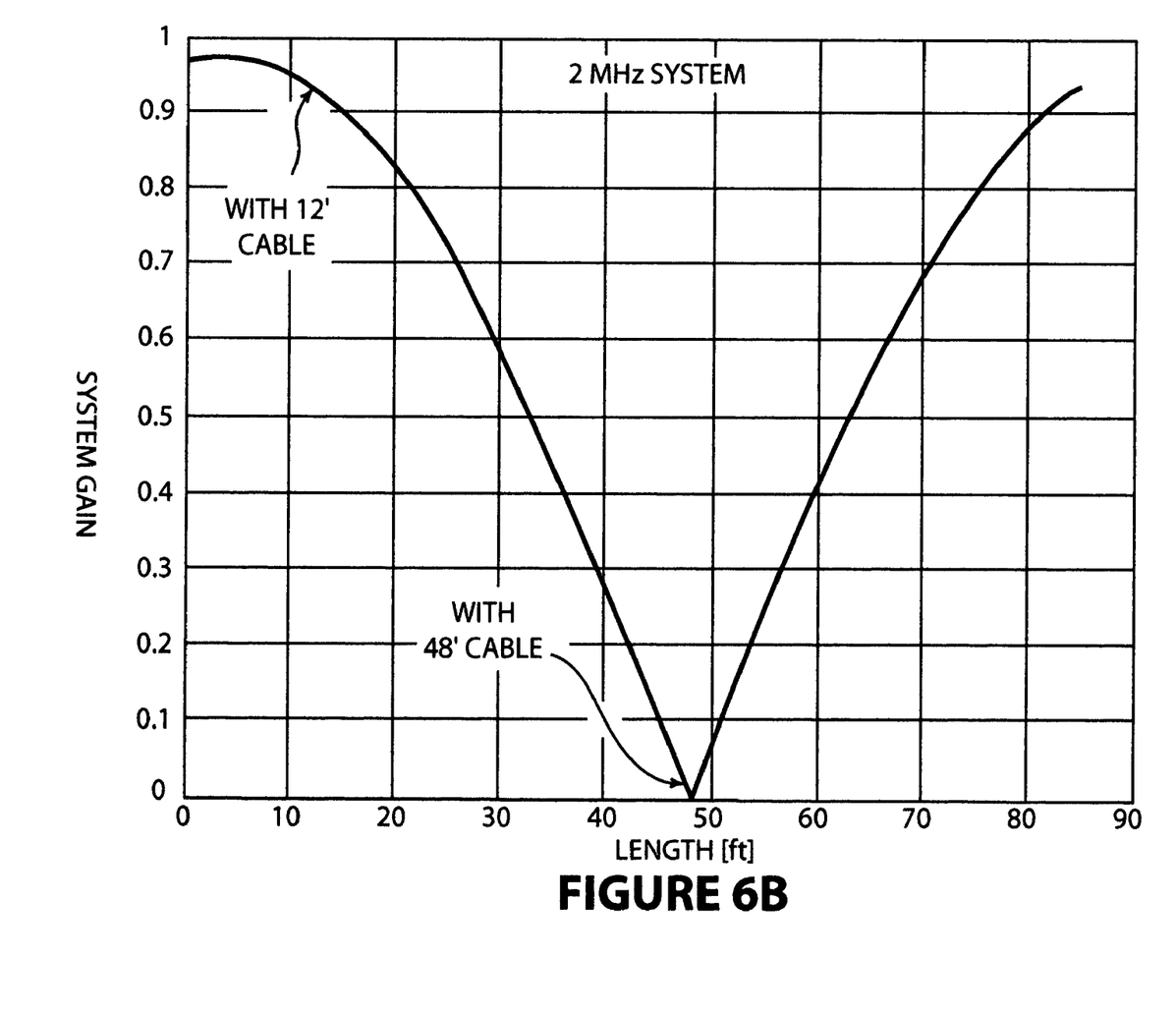

FIG. 6a illustrates a plasma processing system 10 having an RF power generator 12 coupled to a plasma 14 in a plasma chamber 16 through a transmission line 18. In accordance with an embodiment of the invention, a trajectory matching methodology is used to determine the impedance trajectory of the plasma at an operating condition and stabilize the plasma by matching the trajectory of the plasma to the contours of the power delivery system using the reactive properties of the transmission line. In FIG. 6b, the overall system stability gain of the plasma processing system 10 is modeled as a function of the length of the transmission line 18. In this system, operating nominally at a generator frequency of 2 MHz, it is observed that the plasma exhibits instabilities when operating with an interconnecting coaxial power line of one length between the generator and chamber, in this case 12 feet. Referring to FIG. 6b, it can be seen that the system stability gain is very close to 1 at this condition, creating a high probability of instability. When the transmission line is replaced with a line 48 feet in length, the plasma is stabilized. As can be seen in FIG. 6b, the system stability gain for this line length is zero, creating an inherently stable system.

Figure 6C:
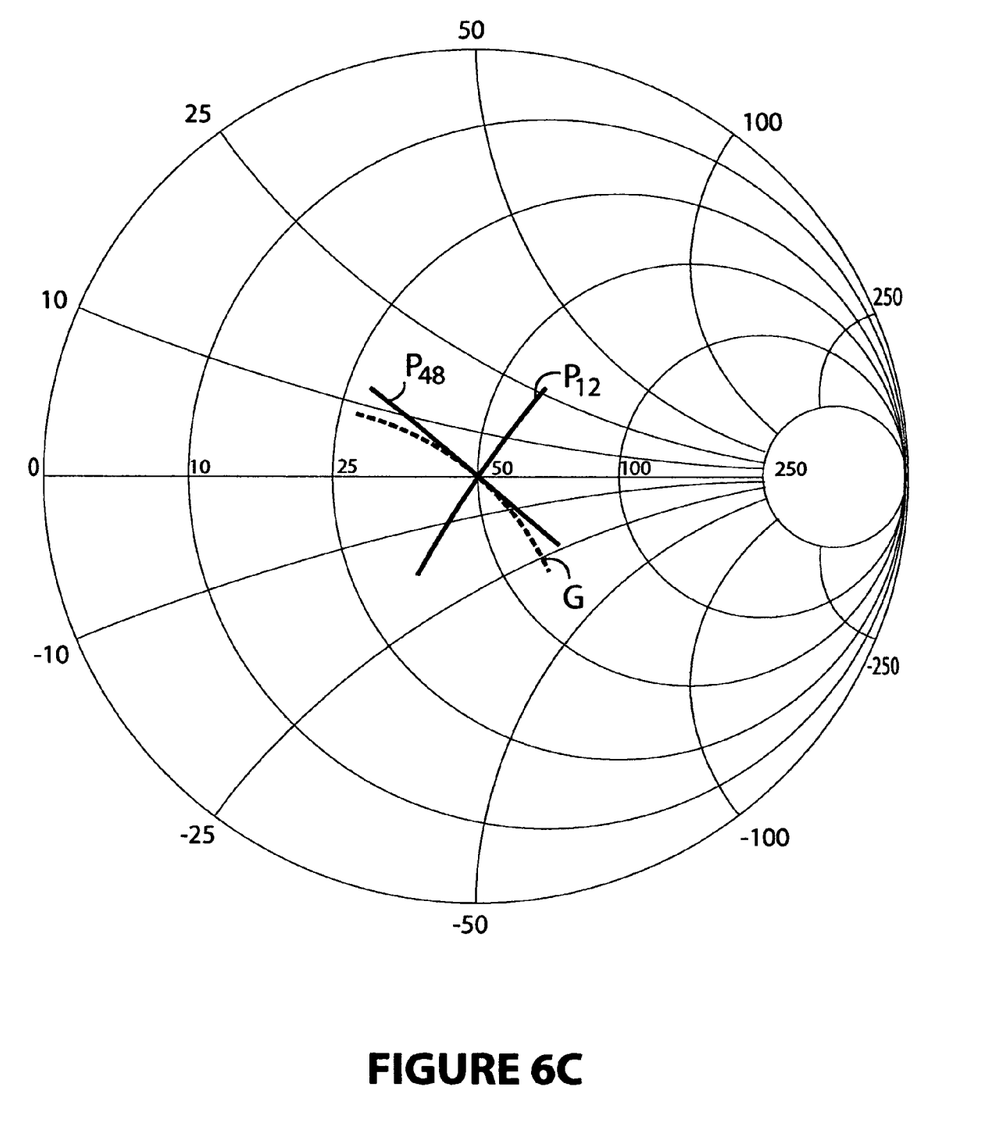

The effect in impedance space of the length of transmission line 18 can be seen in FIG. 6c. For a line length of 48 feet, the plasma trajectory $P_{48}$ is aligned with the generator impedance contour G. For a line length of 12 feet, however, the plasma trajectory $P_{12}$ is nearly orthogonal to that of the generator. In this way, by first determining the plasma trajectory and creating an impedance trajectory model of the generator and transmission line, a line length that avoids unstable generator/plasma interactions may be readily determined. The trajectory matching procedure may be employed to improve plasma stability using transmission line either alone or in combination with other trajectory matching circuitry as described in connection with other embodiments of the invention.

Figure 7A:
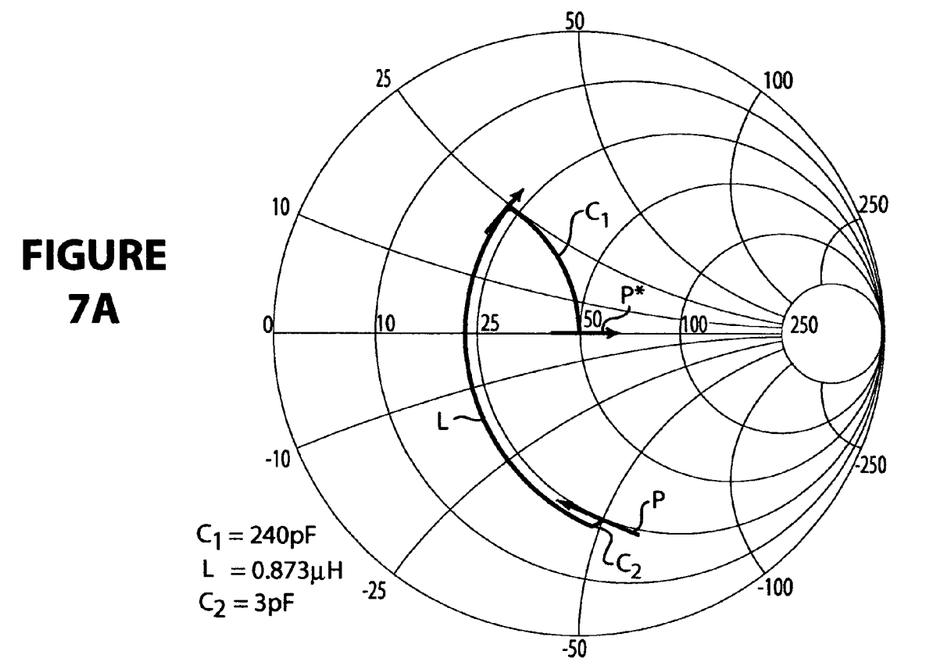
FIGS. 7a and 7b are Smith charts showing two different cases of combined impedance and trajectory matching for an embodiment of the invention.
Figure 7B:
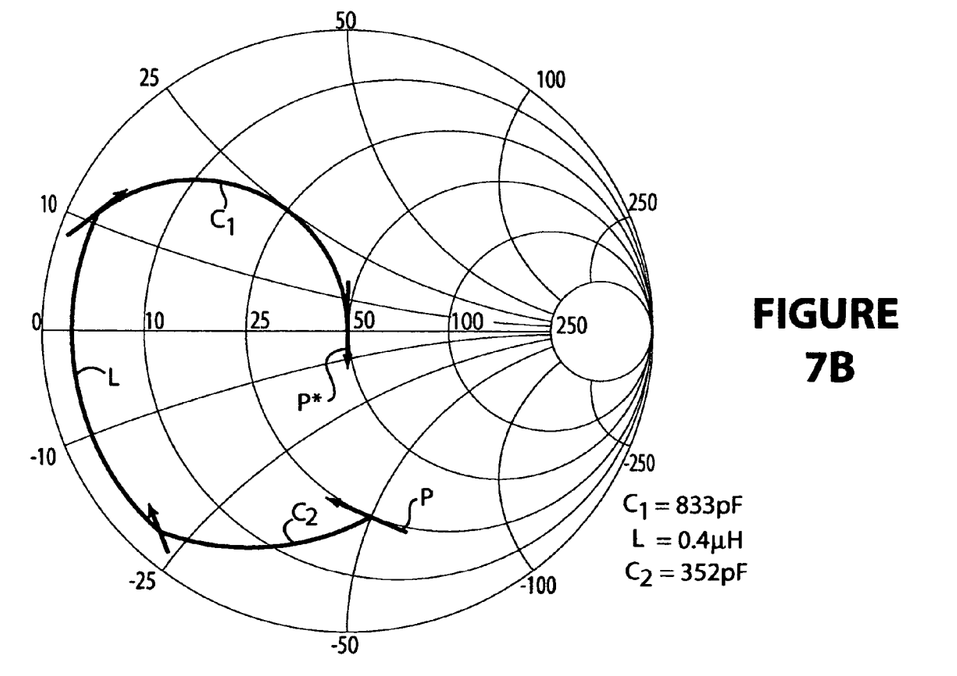

In another embodiment of the invention, the network 20 illustrated in FIG. 3 is a combined impedance and trajectory matching circuit. Impedance and trajectory matching circuit 20 comprises a series inductor L and parallel capacitors $C_1$ and $C_2$. A combined impedance and trajectory matching circuit may comprise alternative combinations of reactive elements, such as those illustrated in FIG. 5. Because the combined impedance and trajectory matching circuit has at least three degrees of freedom in the choice of component values, the real and imaginary components of plasma impedance as well as the impedance trajectory may be matched at a desired operating point. FIGS. 7a and 7b illustrate how the values of $C_1$, L, and $C_2$ may be selected so as to provide identical center impedance matching at a particular operating condition while causing different degrees of trajectory rotation. In FIG. 7a, the 50Ω output impedance of the generator, in this case for an exemplary 13.56 MHz power delivery system, is matched to a load impedance with a real component of 25Ω at −50 degrees phase, with an impedance trajectory aligned with the real axis. In FIG. 7b, different values of $C_1$, L, and $C_2$ are used to match to the same center load impedance, but with an impedance trajectory aligned with the imaginary axis. With proper selection of the combined impedance and trajectory matching circuit components, the plasma impedance trajectory may be rotated to any orientation while matching center output impedance as well.

Figure 8:
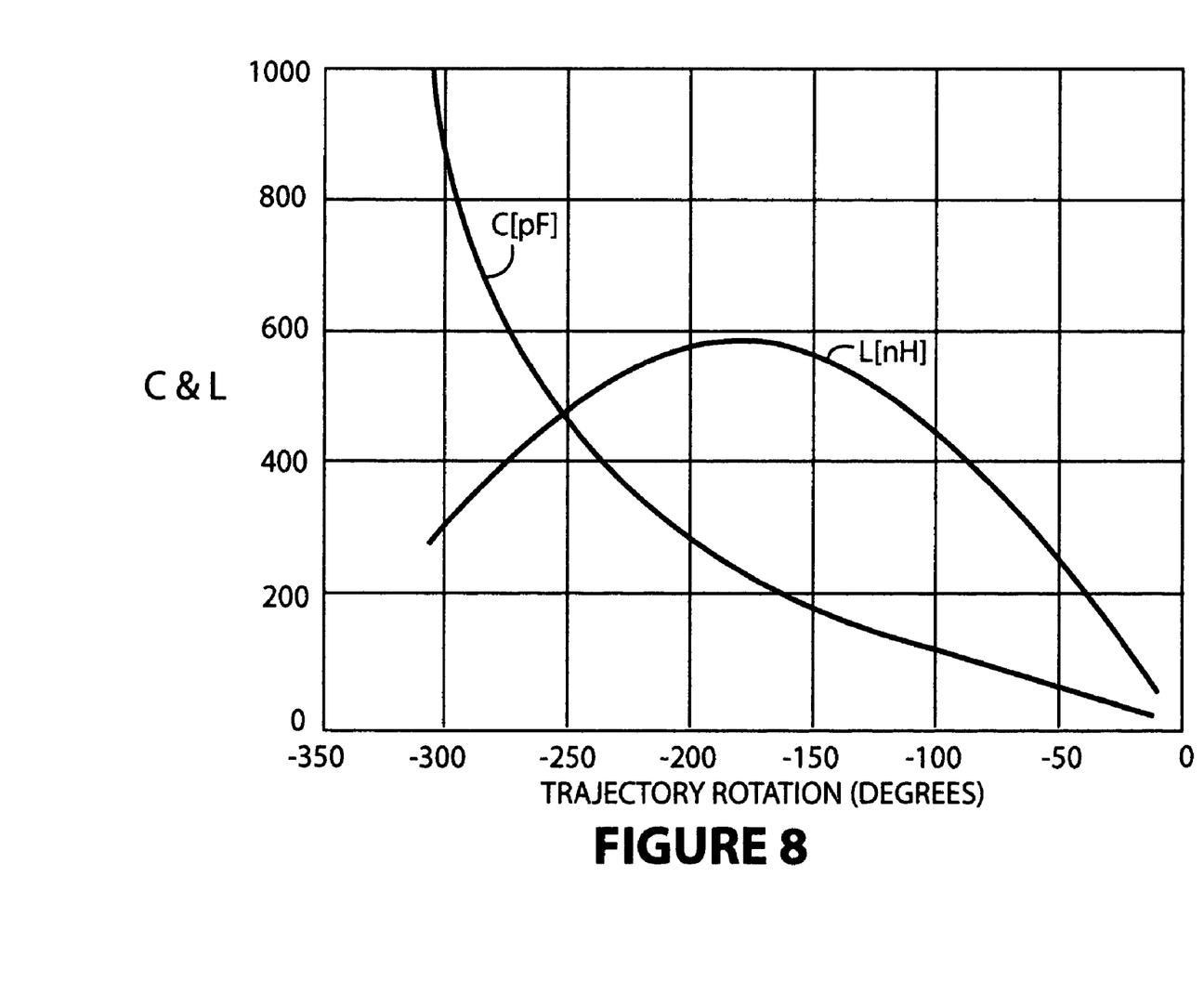
FIG. 8 illustrates the relationship between values of inductive and capacitive elements in an embodiment of the invention comprising a variable trajectory matching circuit.

In other embodiments of the invention, a plasma processing system comprises a variable trajectory matching circuit. In these embodiments, one or more elements of the trajectory matching circuit has reactive properties that may be varied in order to adjust the degree of trajectory rotation produced by the circuit. In one embodiment, the variable trajectory matching circuit comprises the pi network depicted in FIG. 3 in which $C_1$, L and $C_2$ are each variable. FIG. 8 illustrates the values of inductance L and capacitance $C_1=C_2=C$ in this embodiment that result in a center load impedance of 50Ω as a function of the degree of impedance trajectory rotation for a 13.56 MHz system. Thus, by varying the reactive values of the circuit elements according to this relationship, a trajectory match between the generator and plasma can be achieved under process conditions that require different degrees of trajectory rotation. While impedance trajectory variability in this embodiment is provided in the form of continuously variable circuit elements $C_1$, L and $C_2$, impedance variability may also be provided by other means known to those of skill in the art, such as through the use of switched arrays of discrete reactive elements or through variation of the output frequency of the RF generator. Naturally, a variable trajectory matching circuit may comprise alternative combinations of variable reactive elements, for example in configurations such as those illustrated in FIG. 5.

Figure 9:
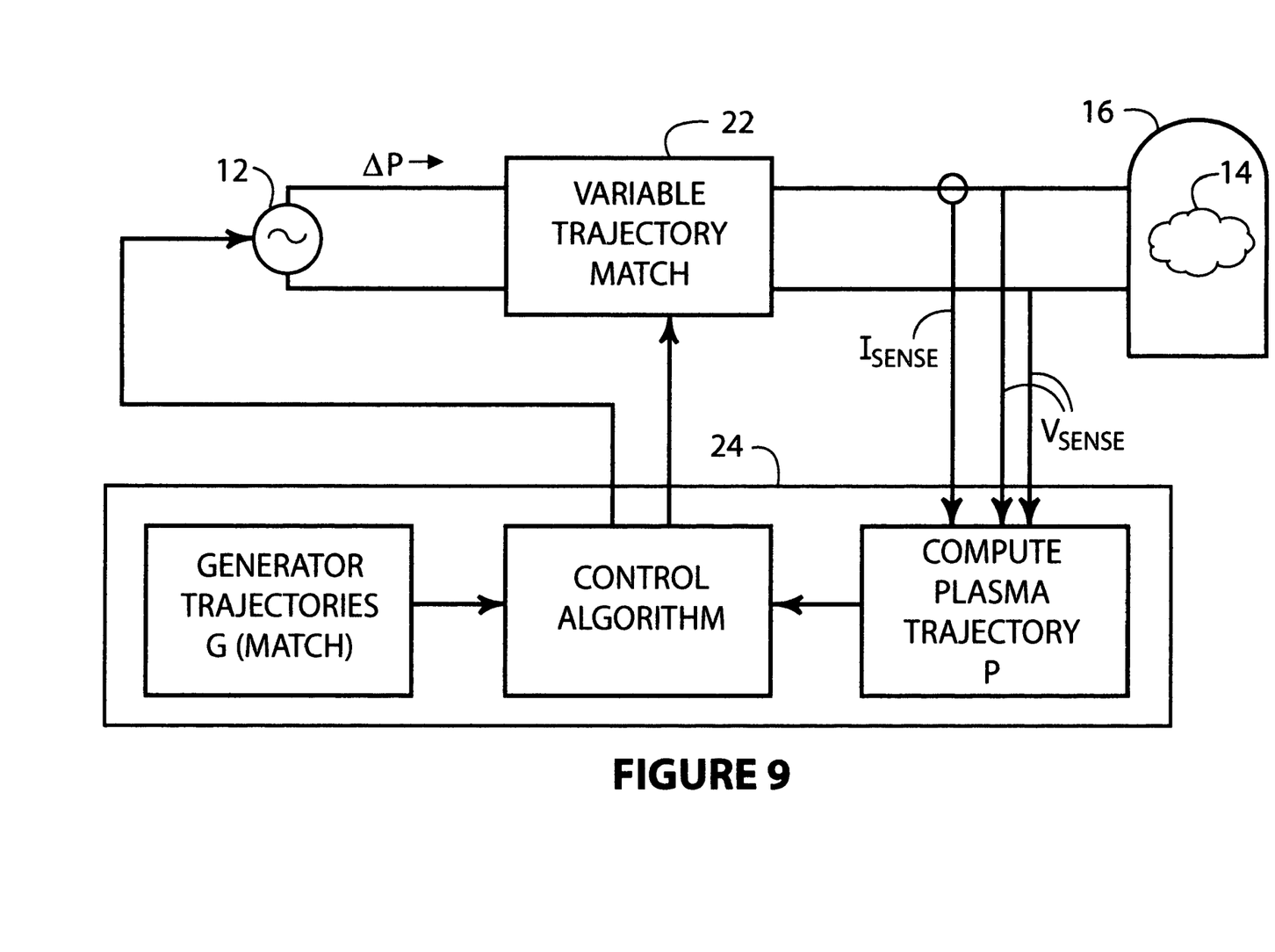
FIG. 9 is a schematic representation of a plasma processing system having a variable trajectory matching circuit and a trajectory match controller in accordance with an embodiment of the invention.

FIG. 9 illustrates an embodiment of the invention having a variable trajectory matching circuit controlled by feedback of plasma impedance properties measured in real time. The variable trajectory matching circuit 22 is disposed between an RF power generator 12 and a plasma chamber 16. Also provided are plasma current and voltage sensors $I_{SENSE}$ and $V_{SENSE}$, respectively, and trajectory match system controller 24. To measure the plasma impedance trajectory during operational conditions, the trajectory match controller 24 directs the generator 12 to deliver a small perturbation in power output ΔP. Using the time-varying measurements of plasma voltage and current at both the baseline and incremented power conditions, the controller 24 computes the magnitude and phase angle (i.e. slope) of the plasma impedance trajectory P. The generator power contours for various match conditions G(Match) reside in a database accessible to the controller 24, having been measured prior to operation. Based on a comparison of the plasma trajectory P and the generator power contours G(Match), the trajectory match controller 24 uses a control algorithm to generate feedback signals to the variable trajectory matching circuit 22. The feedback signals cause adjustments to the variable reactive elements of the trajectory matching circuit, such as values of inductance or capacitance, thereby rotating the plasma impedance trajectory into alignment with the generator power contours at the match condition.

Although there is illustrated and described herein specific structure and details of operation, it is to be understood that these descriptions are exemplary and that alternative embodiments and equivalents may be readily made by those skilled in the art without departing from the spirit and the scope of this invention. Accordingly, the invention is intended to embrace all such alternatives and equivalents that fall within the spirit and scope of the appended claims.

What is claimed is:

1. A method of stabilizing a plasma, comprising:
   a) providing a plasma processing system having a plasma chamber;
   b) providing a power delivery system that furnishes alternating current power to the plasma chamber to create a plasma therein;
   c) determining the impedance trajectory of the plasma at an operating condition; and
   d) stabilizing the plasma by substantially matching the angle of the impedance trajectory of the plasma to a contour of constant power output of the power delivery system.

2. The method of claim 1 wherein the impedance trajectory of the plasma is substantially matched to the contour of constant power output of the power delivery system using trajectory matching circuitry.

3. The method of claim 2 wherein the trajectory matching circuitry comprises a network of reactive electrical elements.

4. The method of claim 3 wherein the network of reactive electrical elements is at least a third order network.

5. The method of claim 3 wherein the network of reactive electrical elements substantially matches both the steady state output impedance and the contour of constant power output of the power delivery system.

6. The method of claim 3 wherein the reactive value of at least one of the elements of the network is variable.

7. The method of claim 6 wherein the impedance trajectory of the plasma is determined during process operation and used to adjust the reactive value of the at least one of the elements of the network.

8. The method of claim 1 wherein the impedance trajectory of the plasma is substantially matched to the contour of constant power output of the power delivery system using a transmission line.

9. A plasma processing system, comprising:
   a) a plasma chamber;
   b) a power delivery system that furnishes alternating current power to the plasma chamber to create a plasma therein; and
   c) trajectory matching circuitry that stabilizes the plasma by substantially matching the angle of the impedance trajectory of the plasma to a contour of constant power output of the power delivery system.

10. The system of claim 9 wherein the trajectory matching circuitry comprises a network of reactive electrical elements.

11. The system of claim 10 wherein the network of reactive electrical elements is at least a third order network.

12. The system of claim 10 wherein the network of reactive electrical elements substantially matches both the steady state output impedance and the contour of constant power output of the power delivery system.

13. The system of claim 10 wherein the reactive value of at least one of the elements of the network is variable.

14. The system of claim 13, further comprising a trajectory match controller that determines the impedance trajectory of the plasma during process operation and adjusts the reactive value of the at least one of the elements of the network to stabilize the plasma.

* * * * *